(12) United States Patent
Nagai et al.

(10) Patent No.: US 6,787,878 B1
(45) Date of Patent: Sep. 7, 2004

(54) SEMICONDUCTOR DEVICE HAVING A POTENTIAL FUSE, AND METHOD OF MANUFACTURING THE SAME

(75) Inventors: Yukihiro Nagai, Tokyo (JP); Tomoharu Mametani, Tokyo (JP); Yoji Nakata, Tokyo (JP); Shigenori Kido, Tokyo (JP); Takeshi Kishida, Hyogo (JP); Akinori Kinugasa, Tokyo (JP); Hiroaki Nishimura, Tokyo (JP); Jiro Matsufusa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 31 days.

(21) Appl. No.: 09/631,623

(22) Filed: Aug. 4, 2000

(30) Foreign Application Priority Data

Dec. 17, 1999 (JP) ............................................ 11-358760

(51) Int. Cl.[7] ......................... H01L 29/00; H01L 21/332
(52) U.S. Cl. ....................... 257/529; 257/50; 257/209; 257/665; 438/131; 438/132; 438/275; 438/333
(58) Field of Search ................... 257/50, 173, 209–210, 257/529–530, 665, 410, 301, 510; 438/131, 132, 275, 281, 333, 600; 365/96, 225.7

(56) References Cited

U.S. PATENT DOCUMENTS 5,241,496 A * 8/1993 Lowrey et al. ............... 365/96
5,629,227 A * 5/1997 Chen ........................... 438/600
5,682,049 A * 10/1997 Nguyen ....................... 257/363
6,090,661 A * 7/2000 Perng et al. ................. 438/248
6,130,469 A * 10/2000 Bracchitta et al. ........... 257/530
6,140,674 A * 10/2000 Hause et al. ................. 257/301
6,165,849 A * 12/2000 An et al. ..................... 438/275

FOREIGN PATENT DOCUMENTS

| DE | 100 22 767 A 1 | 11/2001 |
| JP | 01-295440 | * 11/1989 |
| JP | 8-139195 | 5/1996 |
| JP | 08-153799 | 6/1996 |
| TW | 426947 | 3/2001 |

* cited by examiner

Primary Examiner—Donghee Kang
(74) Attorney, Agent, or Firm—McDermott Will & Emery LLP

(57) ABSTRACT

In a semiconductor device, an active region is formed in a semiconductor substrate separated by a plurality of isolation regions. A plurality of surface insulating films of different thickness are formed separately on the active region. A plurality of conductive films are formed on the respective insulating films. Then, one of the surface insulating film having smaller thickness is caused to break down to work as an electric fuse.

1 Claim, 5 Drawing Sheets

SEMICONDUCTOR DEVICE HAVING A POTENTIAL FUSE, AND METHOD OF MANUFACTURING THE SAME

BACKGROUND OF THE INVENTION

1. Field of the Invention

The present invention relates to a semiconductor device, and more particularly, to a semiconductor device equipped with an electric fuse. The present invention further relates to a method of manufacturing such semiconductor device.

2. Background Art

In a process of manufacturing a semiconductor device such as a memory device, various tests are performed in a wafer stage. In one test, a metal interconnection is cut by radiation of a laser beam from the outside onto a predetermined area on the interconnection. In other test, a voltage is applied to a specific interlayer film in a semiconductor chip, to thereby electrically break the interlayer dielectric film and induce a short circuit in the interlayer dielectric film to act as an electric fuse. Through such tests, a failed wafer is repaired or a wafer is subjected to voltage control.

However, in a case where a metal interconnection is exposed to a lasers, the wafer must be in a state such that the interconnection can be subjected to laser irradiation. Therefore, laser irradiation of an interconnection can be employed only in a wafer stage. After the wafer has been diced into semiconductor chips, laser irradiation cannot be performed.

In the course of laser irradiation, damage is imparted to a circuit located around a target position on the wafer. Hence, a circuit cannot be located near or below a fuse section, thus rendering chip layout difficult.

In the event of a failure arising in the radiation position for any reason, very serious damage such as destruction of a peripheral circuit occurs, thus making repair of a semiconductor device impossible.

Application of a voltage to cause an interlayer film to act as an electric fuse can be effected even after a semiconductor chip has been assembled. Further, application of a voltage inflicts less damage on surroundings of the electric fuse than does laser irradiation. Hence, circuits can be fabricated in positions above and below the electric fuse, thereby advantageously facilitating chip layout. However, a limited voltage can be applied to the inside of the semiconductor chip. In order to destroy an interlayer film thoroughly, the area of an electric fuse to be subjected to application of a voltage must be increased, thus hindering miniaturization of a semiconductor chip.

SUMMARY OF THE INVENTION

The present invention has been conceived to solve the above-mentioned drawback of the background art and is aimed at providing a semiconductor device whose electric fuse is fabricated with a very thin film so as to enable performance of electric fuse trimming by means of application of a voltage, which trimming yields many advantages, as well as providing a manufacturing method which enables fabrication of an electric fuse or a capacitor within a narrow area by utilization of a transistor trench isolation LOCOS manufacturing process.

In one aspect of the present invention, a semiconductor device comprises at least an active region formed in the semiconductor substrate separated by a plurality of isolation regions. A surface insulating film is formed on a surface of the active region. A conductive film is formed on the surface insulating film. The surface insulating film is formed relatively thin to be broken down and to work as an electric fuse.

In another aspect, the semiconductor device comprises a plurality of surface insulating films formed on a surface of the active region of the semiconductor substrate, and the surface insulating films are formed at different thicknesses. A plurality of conductive films are formed on each of the surface insulating films. Then, one of the surface insulating films having smaller thickness is caused to break down and to work as an electric fuse.

In another aspect, a semiconductor device comprises at least an active region formed in the semiconductor substrate separated by a plurality of isolation regions. At least a trench is formed in the active region. A surface insulating film is formed along a surface of the trench. A conductive film is formed on the surface insulating film. The surface insulating film is formed relatively thin to be broken down for forming an electric fuse. Alternatively, the surface insulating film is formed relatively thin to work as a dielectric film for forming a capacitor.

Other and further objects, features and advantages of the invention will appear more fully from the following description.

DETAILED DESCRIPTION OF THE PREFERRED EMBODIMENTS

First Embodiment

A first embodiment of the present invention will now be described.

Figure 1:
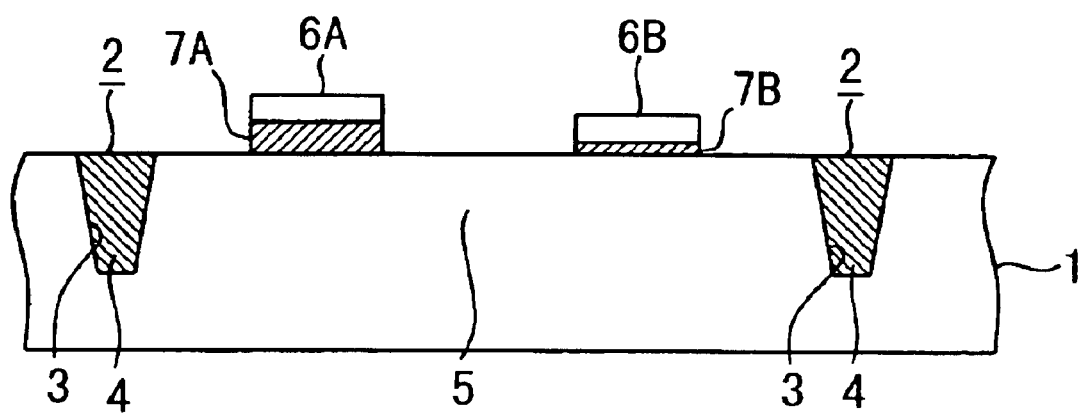
FIG. 1 is a cross-sectional view schematically showing a trench isolated dual gate transistor for describing a first embodiment of the present invention.

FIG. 1 is a cross-sectional view schematically showing a trench isolated dual gate transistor for describing the first embodiment of the present invention. In the drawing, reference numeral 1 designates a semiconductor substrate; and 2 designates a trench isolation region formed in the semiconductor substrate. The trench isolation region 2 is formed from a trench 3 and a dielectric film 4 embedded in the trench 3.

Reference numeral 5 designates an active region; and 6A designates a first gate electrode positioned on the active region 5 with a comparatively thick gate oxide film 7A being sandwiched therebetween. Reference numeral 6B designates a second gate electrode placed on the active region 5 with a very thin gate oxide film 7B being sandwiched therebetween.

A voltage applied to the first gate electrode 6A on the thick gate oxide film 7A is higher than a voltage applied to the second gate electrode 6B. The first and second gate electrodes 6A and 6B act as a known dual gate.

The first embodiment is characterized in that the gate oxide film 7B formed from a very thin dielectric film is used as a fuse.

Since a thin dielectric film is apt to break upon application of a voltage, electric fuse trimming can be effectively carried out even when the area of a junction between a semiconductor chip and a gate oxide film is made small. Accordingly, all the advantages stemming from electric fuse trimming can be enjoyed. So long as the electric fuse is formed from a gate oxide film, the fuse can be used by means of diversion of a portion of the gate oxide film used in a non-memory device, such as an ASIC (application-specific IC), in which a fuse is not used in a common way. Further, a thin gate oxide film can also be used as a dielectric of a capacitor.

In a case where the thin gate oxide film 7B of a device of dual gate structure shown in FIG. 1 is used as a fuse, the high potential voltage applied to the first gate electrode 6A formed from a thick gate oxide film is applied to the second gate electrode 6B, thus breaking down the thin gate oxide film 7B and inducing a short circuit between the second gate electrode 6B and the semiconductor substrate 1.

In one aspect, the method of manufacturing a semiconductor device according to the present embodiment may be summarized as follows. In the method, an active region 5 is formed in a semiconductor substrate 1. A plurality of isolation regions 2 are formed for separating the active region 5. A plurality of gate electrodes (conductive films) 6A, 6B are formed in the active regions 5 via gate oxide films (insulating films) 7A, 7B of different thickness. A thin gate oxide film 7B is destroyed by application of a voltage to a gate electrode 6B provided on the thin gate oxide film 7B. Thus, the thin gate oxide film 7B is caused to act as an electric fuse.

Second Embodiment

A second embodiment of the present invention will now be described by reference to the corresponding drawings.

The second embodiment is intended to provide a method of manufacturing a semiconductor device including a gate oxide film. The second embodiment is characterized by utilization of a transistor trench isolation LOCOS preparation process. FIGS. 2 through 8 are cross-sectional views showing a manufacturing process according to the second embodiment. In order to make the characteristic of the present invention easy to understand, each set of drawings illustrates three sections which are extracted from a semiconductor device and are arranged side by side; namely, (A) a memory cell section, (B) a peripheral circuit section having a wide active region, and (C) a section constituting an electric fuse section, a capacitor section, or a photolithography mark section. The remaining area of the semiconductor device are omitted.

A process for manufacturing a semiconductor device will now be described sequentially.

Figure 2:
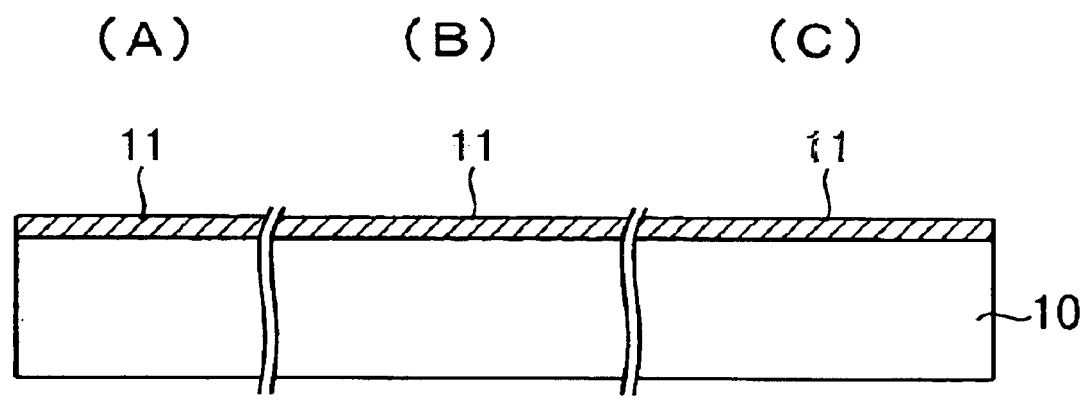
FIGS. 2 through 8 are cross-sectional views showing a manufacturing process according to a second embodiment of the present invention.

As shown in FIG. 2, a layer 11 is formed, as an etching stopper layer to be described later, from SiN or polysilicon over a primary surface of a semiconductor substrate 10 so as to cover all three sections (A), (B), and (C). In the description that follows, the layer 11 is taken as an SiN layer.

Figure 3:
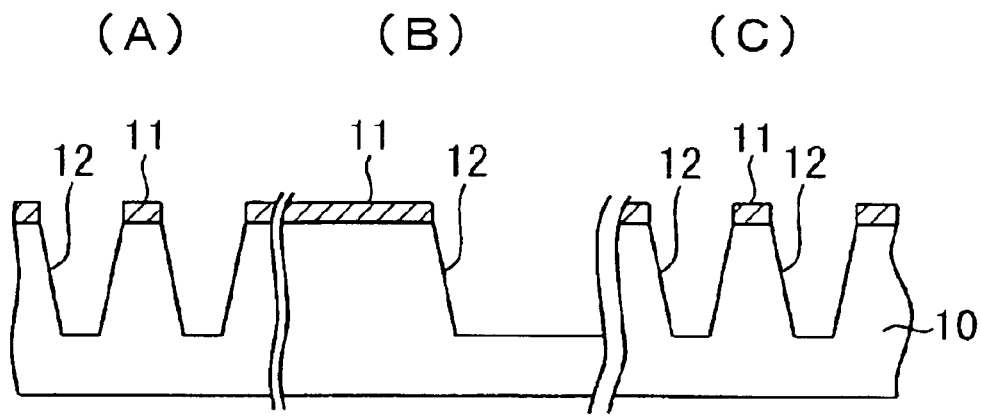

As shown in FIG. 3, after the semiconductor substrate 10 has been subjected to photolithography, a plurality of trenches 12, in which an isolation LOCOS structure is to be formed, are formed in each of the three sections (A), (B), and (C) by means of etching.

Figure 4:
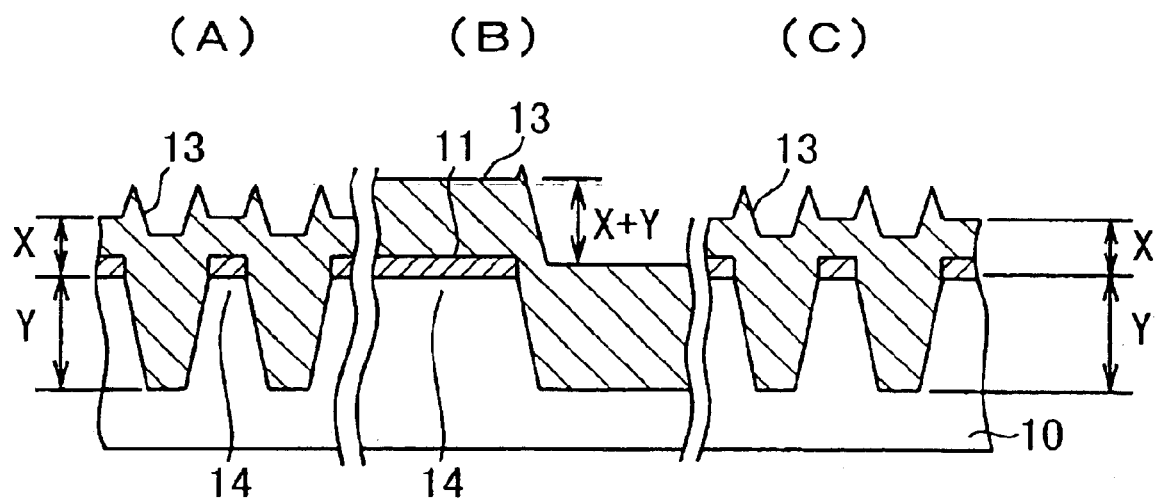

Subsequently, as shown in FIG. 4, an $SiO_2$ layer 13 serving as a dielectric film is deposited within each of the thus-formed trenches 12. At this time, provided that the $SiO_2$ layer 13 is deposited to a thickness of, for example, 5000 angstroms and the trench 12 is formed to a depth of, for example, 3000 angstroms, the trench 12 formed in section (A) assumes a depth Y=3000 angstroms, and the $SiO_2$ layer 13 formed above the surface of the semiconductor substrate 10 assumes a thickness X=2000 angstroms. The trench 12 and the $SiO_2$ layer 13 formed in section (A) are substantially equal in depth and thickness with their counterparts formed in section (C). In contrast, the active region 14 in section (B) is wide; that is, the area of the active region 14 where no trench 12 is to be formed is wide, and the $SiO_2$ layer 13 of 5000 angstroms is fully deposited on the active region 14, and hence only the $SiO_2$ layer 13 formed in section (B) becomes high, as illustrated.

In the next process, the $SiO_2$ layer 13 laid on the SiN layer 11 is scraped by means of CMP, thereby smoothing the surface of the wafer. Although the $SiO_2$ layer 13 can be scraped from the surface of the SiN layer 11 in sections (A) and (C), the $SiO_2$ layer 13 still remains in only the active region 14 in section (B). In order to completely eliminate the $SiO_2$ layer 13, the wafer is subjected to pre-etching after the process shown in FIG. 4. The pre-etching is intended to etch away the $SiO_2$ layer 13 deposited to 5000 angstroms in the active region 4 of section (B) shown in FIG. 4, before the wafer is subjected to CMP.

The second embodiment is characterized in that all the $SiO_2$ layers 13 deposited in the trenches 12 in section (C) are removed in the pre-etching process.

Figure 5:
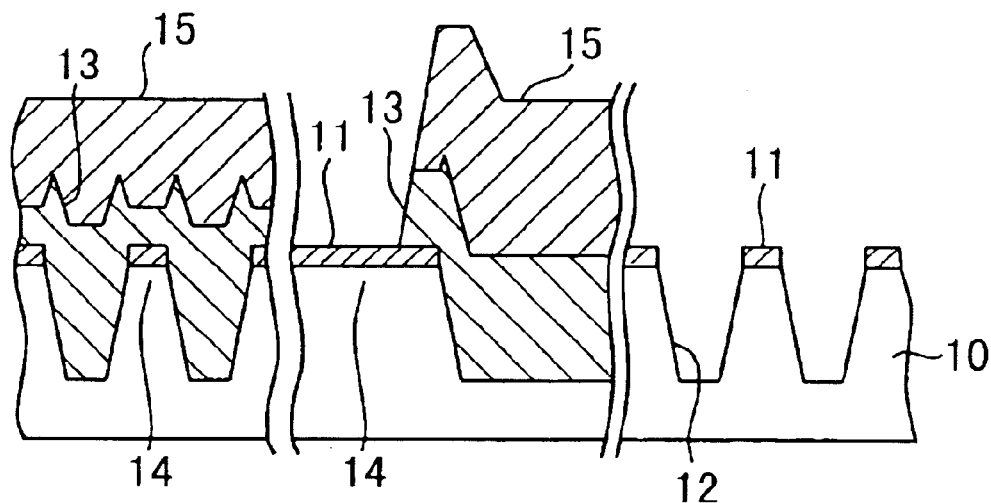

As shown in FIG. 5, a resist film 15 is formed on the $SiO_2$ layer 13, and the resist film 15 formed in the active region 14 of section (B) and the resist film 15 formed in section (C) are removed through photolithography. Subsequently, the $SiO_2$ layer 13 is removed from the active region 14 of section (B) and section (C) by means of etching.

The $SiO_2$ layer 13 has been deposited to a thickness of 5000 angstroms in the active region 14 of section (B), and the total thickness of the $SiO_2$ layer 13 consisting of portion Y deposited in the trench 12 and portion X deposited above the surface of the semiconductor substrate 1 is 5000 angstroms. When the $SiO_2$ layer 13 deposited in the active region 14 of section (B) is etched away up to the SiN layer 11 serving as an etching stopper layer, the entire $SiO_2$ layer 13, which consists of the portions X and Y and is deposited in section (C), is removed completely.

There may also be a case where only the $SiO_2$ layer 13 deposited in the photolithography mark section (C) may be removed without pre-etching of the $SiO_2$ layer 13 deposited in section (B).

Figure 6:
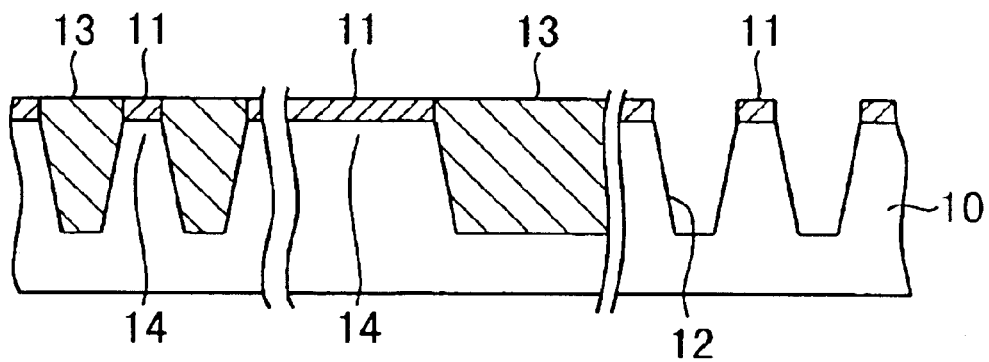

As shown in FIG. 6, after the resist film 15 has been removed from the wafer in the foregoing state, the $SiO_2$ layer 13 protruding from the level of the SiN layer 11 is abraded and removed by means of CMP.

Figure 7:
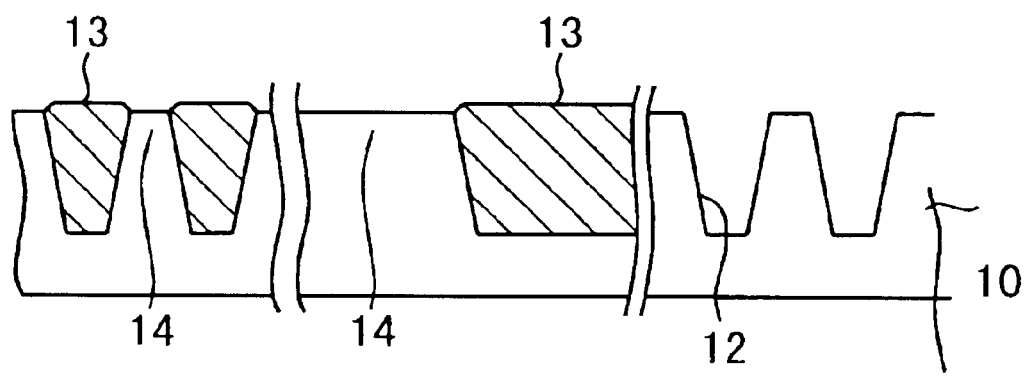
Figure 8:
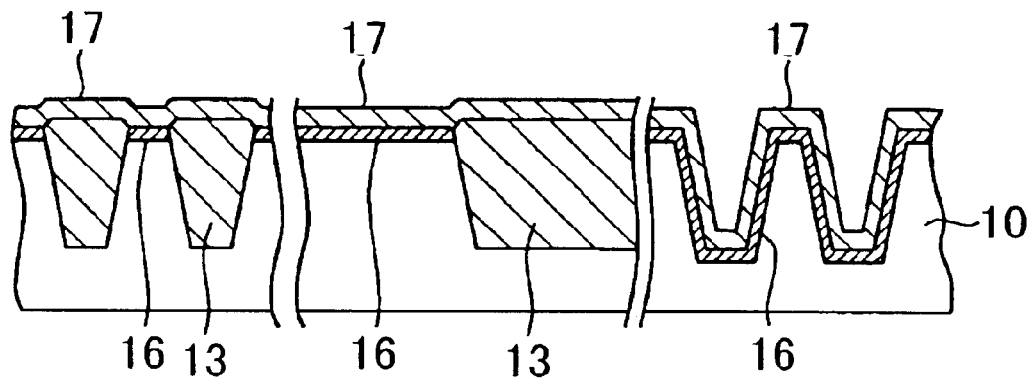

After the SiN layer 11 has been removed from the wafer as shown in FIG. 7, an $SiO_2$ film 16 serving as a gate oxide film is formed as shown in FIG. 8, and a transfer gate 17 is formed over the wafer.

In section (C), the gate oxide film 16 and the transfer gate 17 are formed on the interior surfaces of the trenches 12. The area in section (C) where the gate oxide film 16 and the transfer gate 17 are formed occupies a small area on the primary surface of the semiconductor substrate 10. However, the area in which the transfer gate 17 faces the semiconductor substrate 10 is large.

A plurality of trenches 12 are formed in section (C), as required, and the surface area of the trenches 12 can be made wider through repeated patterning.

In a case where section (C) is used as an electric fuse, the gate oxide film 16 is broken down by application of a strong electric field to an area between the semiconductor substrate 10 and the transfer gate 17, thus inducing a short circuit therebetween. In contrast, in a case where section (C) is used as a capacitor, the gate oxide film 16 is utilized as a dielectric of the capacitor without involvement of a short circuit between the semiconductor substrate 10 and the transfer gate 17.

In one aspect, the method of manufacturing a semiconductor device according to the present embodiment may be summarized as follows.

In the method, an etching stopper layer 11, such as a SiN layer or a composite layer of SiN and polysilicon, is formed on a primary surface of a semiconductor substrate 10. In a first section A of the semiconductor substrate 10, a first trench 12 are formed for separating an active region into sub-regions 14. In a second section B of the semiconductor substrate 10, a second trench 12 is formed for separating the active region into regions 14 wider than the sub-regions 14. In a third section C of the semiconductor substrate 10, third trenches 12 are formed. A dielectric film 13 is formed in the interiors of the trenches 12 and on the active regions 14. The dielectric film 13 is removed from the wider active regions 14 and from the interior of the third trench 12 by means of photolithography. The dielectric film protruding from the etching stopper layer 11 is abraded and removed by means of CMP. The etching stopper layer 11 is removed. A gate oxide film (insulating film) 16 is formed on the active regions 14 and the interior surface of the third trench 12. A transfer gate (conductive film) 17 is formed on the gate oxide film 16 and on the dielectric film 13 in the first and second trenches 12. Further, the gate oxide film 16 formed in the third trench 12 in the section C is caused to act as an electric fuse.

In another aspect, in the method, the gate oxide film 16 formed in the third trench 12 in the section C is used as a dielectric film for forming a capacitor.

In another aspect, in the method, a plurality of third trenches are formed at predetermined intervals, and the gate oxide film is formed in respective interior surfaces of the third trenches.

Third Embodiment

A third embodiment of the present invention will now be described.

Figure 9:
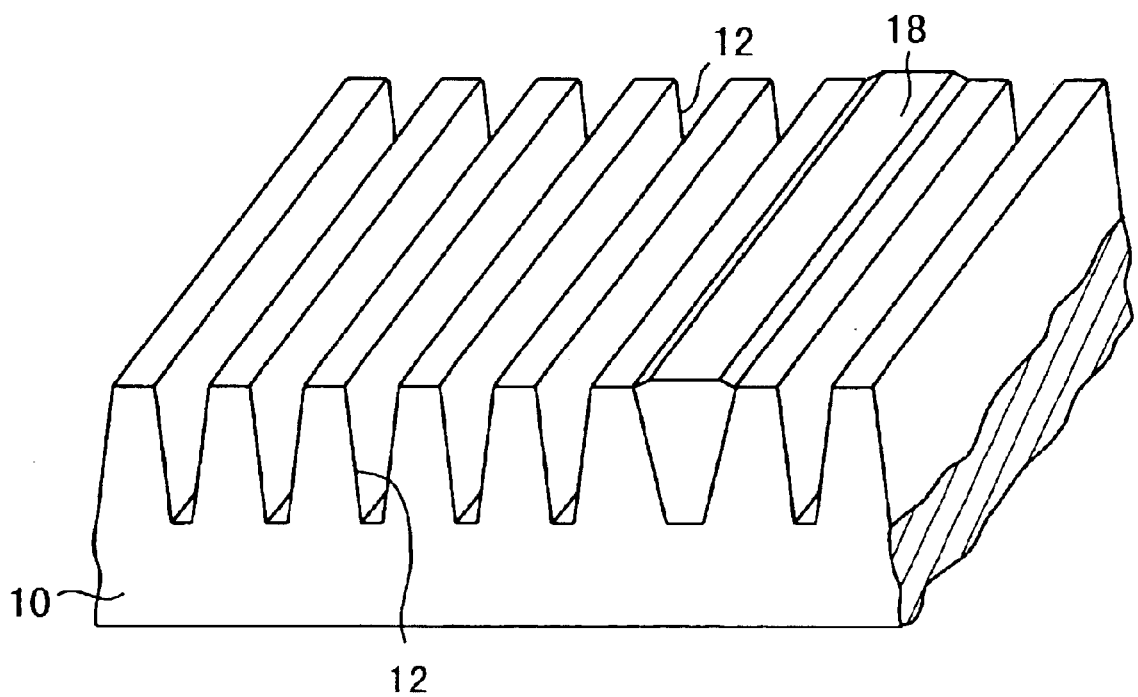
FIG. 9 is a schematic perspective view of a semiconductor device according to a third embodiment of the present invention.

FIG. 9 is a schematic perspective view of a section (C) as shown in FIGS. 2 to 8, illustrating a structure of a semiconductor device to which the third embodiment is applied.

In the drawing, the elements which are the same as or correspond to those shown in FIGS. 2 through 8 are assigned the same reference numerals. The third embodiment differs from the second embodiment shown in FIGS. 2 through 8 in that a dielectric film 18 for preventing excessive abrasion, which would otherwise be caused by CMP, is embedded in one of the trenches 12. More specifically, reference numeral 18 designates a dielectric film which is embedded in one of the trenches 12 and acts as a stopper for preventing excessive abrasion, which would otherwise be caused during a CMP process.

The dielectric film 18 as a stopper may be embedded in the plurality of trenches 12 in section (C), in accordance with the total number of trenches 12. In this case, the dielectric film 18 may be embedded in adjacent trenches 12 or provided at appropriate intervals.

In one aspect, the method of manufacturing a semiconductor device according to the present embodiment may be summarized as follows. In the method, a plurality of third trenches 12 are formed at predetermined intervals in the section C, and the gate oxide film 16 is formed on respective interior surfaces of the third trenches 12. A dielectric film 18 is formed in at least one of the third trenches 12 for preventing excessive abrasion, which would otherwise be caused by CMP process.

A plurality of stoppers 18 may be embedded in the plurality of trenches 12 in section (C), in accordance with the total number of trenches 12. In this case, the trenches 12 may be embedded in adjacent trenches 12 or provided at appropriate intervals.

The features and advantages of the present invention as exemplified in the above embodiments may be summarized as follows.

A semiconductor device of the present invention comprises an active region formed in a semiconductor substrate; isolation regions for separating the active region into subdivisions; and a gate formed in the active regions via a gate oxide film, wherein the gate oxide film is used as an electric fuse. An electrical fuse can be formed from a thin film in a small area, thereby enabling adoption of the electric fuse trimming technique.

Further, another semiconductor device of the present invention comprises an active region formed in a semiconductor substrate; isolation regions for separating the active region into sub-divisions; and a plurality of gates formed in the active regions via gate oxide films of different thickness, wherein a thin gate oxide film is used as an electric fuse. A dielectric film can be readily destroyed.

The present invention provides a method of manufacturing a semiconductor device comprising a plurality of gates formed in active regions via gate oxide films of different thickness, wherein a thin gate oxide film is destroyed by application of a voltage to a gate provided on a thin gate oxide film, thus causing the thin gate oxide film to act as an electric fuse. As a result, a gate oxide film can be readily destroyed, thus facilitating fabrication of an electric fuse.

According to a method of manufacturing a semiconductor device, a transistor trench isolation LOCOS preparation process is utilized for forming an electric fuse or capacitor, thus enabling fabrication of an electric fuse or capacitor without involvement of addition of a special manufacturing step.

According to a method of manufacturing a semiconductor device, a gate oxide film to be used for fabricating an electric fuse or capacitor is provided on the interior surfaces of a plurality of trenches formed at given intervals. Although the area where the gate oxide film is formed occupies a small area on the primary surface of the semiconductor substrate, the substantive area of the gate oxide film can be made larger.

According to a method of manufacturing a semiconductor device, a dielectric film for preventing occurrence of excessive abrasion, which would otherwise be caused by CMP, is embedded in one of trenches to be used for fabricating an electric fuse or capacitor, thus enabling accurate abrasion of a dielectric film.

Obviously many modifications and variations of the present invention are possible in the light of the above teachings. It is let therefore to be understood that within the scope of the appended claims the invention may by practiced otherwise than as specifically described.

The entire disclosure of a Japanese Patent Application No. 11-358760, filed on Dec. 17, 1999 including specification, claims, drawings and summary, on which the Convention priority of the present application is based, are incorporated herein by reference in its entirety.

What is claimed is:

1. A semiconductor device comprising:

a semiconductor substrate; and a plurality of trenches, having an interior surface formed by side surfaces and a bottom surface, formed in the semiconductor substrate;

an etching stopper film embedded at least in a selected one of the trenches;

a surface insulating film formed along the side surfaces and bottom surface lining the interior surface of other trenches and along a surface of the semiconductor substrate; and a conductive film formed at least on the surface insulating film, wherein the surface insulating film is sufficiently thin to be broken down for forming an electric fuse.

* * * * *